(12) United States Patent
Cho et al.

(10) Patent No.: US 10,599,186 B2
(45) Date of Patent: Mar. 24, 2020

(54) FLEXIBLE HOUSING AND ELECTRONIC DEVICE INCLUDING THE SAME

(71) Applicant: Samsung Electronics Co., Ltd., Suwon-si, Gyeonggi-do (KR)

(72) Inventors: Chang Sin Cho, Seoul (KR); Sun Woong Ham, Seoul (KR); Haruo Hayashi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/663,009

(22) Filed: Jul. 28, 2017

(65) Prior Publication Data

US 2018/0032107 A1 Feb. 1, 2018

(30) Foreign Application Priority Data

Jul. 28, 2016 (KR) ........................ 10-2016-0096282

(51) Int. Cl.
| | |
|---|---|
| *G06F 1/16* | (2006.01) |
| *G06F 3/041* | (2006.01) |
| *H01M 2/16* | (2006.01) |
| *H04M 1/02* | (2006.01) |
| *H01L 51/00* | (2006.01) |

(52) U.S. Cl.
CPC ............ *G06F 1/1652* (2013.01); *G06F 1/163* (2013.01); *G06F 1/1656* (2013.01); *G06F 3/0412* (2013.01); *H01M 2/16* (2013.01); *H04M 1/0202* (2013.01); *G06F 2203/04102* (2013.01); *H01L 51/0097* (2013.01); *H04M 1/0268* (2013.01)

(58) Field of Classification Search
CPC .... G06F 1/1652; G06F 1/1615; G06F 3/0412; G06F 1/163; G06F 2203/04102; H04M 1/0202; H04M 1/0268; H01M 2/16; H01L 51/0097
See application file for complete search history.

(56) References Cited

U.S. PATENT DOCUMENTS

| | | | |
|---|---|---|---|
| 7,710,370 B2 * | 5/2010 | Slikkerveer | ............... G09F 9/35 345/31 |
| 8,776,418 B1 | 7/2014 | Martinez et al. | |
| 9,120,290 B2 | 9/2015 | Krall et al. | |
| 9,642,241 B2 | 5/2017 | Huitema et al. | |
| 9,668,550 B2 | 6/2017 | Seo et al. | |
| 10,194,543 B2 * | 1/2019 | Seo | ........................ G06F 1/1652 |

(Continued)

FOREIGN PATENT DOCUMENTS

KR     10-2015-0035232 A     4/2015

*Primary Examiner* — Daniel P Wicklund
*Assistant Examiner* — Sagar Shrestha
(74) *Attorney, Agent, or Firm* — Jefferson IP Law, LLP

(57) ABSTRACT

An electronic device is provided. The electronic device includes a housing. The housing includes at least one open surface, a display disposed in an interior space of the housing. At least a portion of the display is exposed through the opened surface of the housing, and at least one electronic component is disposed between the display and the housing. The housing includes at least one slit passing through at least a partial area of a first side surface, a lower surface, and a second surface facing the first side surface with a specific width and extending from the first side surface to the second side surface via a first periphery of the lower surface and a second periphery facing the first periphery.

12 Claims, 13 Drawing Sheets

(56) References Cited

U.S. PATENT DOCUMENTS

| | | | |
|---|---|---|---|
| 2008/0144265 A1* | 6/2008 | Aoki | G06F 1/1601 361/679.04 |
| 2011/0176260 A1* | 7/2011 | Walters | G06F 1/1641 361/679.01 |
| 2012/0314546 A1 | 12/2012 | Brewer et al. | |
| 2014/0099479 A1 | 4/2014 | Krall et al. | |
| 2014/0174958 A1 | 6/2014 | Martinez et al. | |
| 2014/0197317 A1* | 7/2014 | Yang | G06F 1/3231 250/341.8 |
| 2014/0337621 A1* | 11/2014 | Nakhimov | G06F 1/163 713/168 |
| 2015/0062840 A1* | 3/2015 | Kim | G06F 1/1652 361/749 |
| 2015/0089974 A1* | 4/2015 | Seo | A44C 5/0076 63/1.13 |
| 2015/0370333 A1* | 12/2015 | Ataee | G06F 3/017 345/156 |
| 2016/0014919 A1* | 1/2016 | Huitema | G06F 1/1652 313/511 |
| 2016/0070305 A1 | 3/2016 | Kim et al. | |
| 2016/0077552 A1 | 3/2016 | Liu | |
| 2016/0081180 A1 | 3/2016 | Huitema et al. | |
| 2016/0081204 A1* | 3/2016 | Park | G06F 1/1652 361/807 |
| 2016/0118616 A1* | 4/2016 | Hiroki | H01L 51/0097 257/40 |
| 2016/0216737 A1* | 7/2016 | Hayk | G06F 1/1652 |
| 2016/0306393 A1* | 10/2016 | Huitema | G06F 3/0346 |

\* cited by examiner

FLEXIBLE HOUSING AND ELECTRONIC DEVICE INCLUDING THE SAME

CROSS-REFERENCE TO RELATED APPLICATION(S)

This application claims the benefit under 35 U.S.C. § 119(a) of a Korean patent application filed on Jul. 28, 2016 in the Korean Intellectual Property Office and assigned Serial number 10-2016-0096282, the entire disclosure of which is hereby incorporated by reference.

TECHNICAL FIELD

The present disclosure relates to a structural design technology of a flexible electronic device.

BACKGROUND

As the smartphone market has become mature, wearable devices have been suggested as a mobile technology that may replace the smartphones. The wearable devices are electronic devices mounted or attached to a part of a human body, and have an advantage of small sizes and light weights and may improve the troublesome portability of the existing electronic devices (e.g., the smartphones). Further, the wearable devices overcome the simple concept of the electronic devices, and are recognized as design products that may express the personalities of the individuals and thus may be generally commercialized.

The mounting feeling of the wearable devices may act as an important element in operating the devices. However, the wearable devices may not agree with various body conditions as they pursue natural shapes and sizes.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a flexible housing that may be deformed to a shape that is suitable for an operating environment, and an electronic device including the same.

In accordance with an aspect of the present disclosure, an electronic device is provided. The electronic device may include a housing. The housing includes at least one open surface, a display disposed in an interior space of the housing, at least a portion of the display exposed through the opened surface of the housing, and at least one electronic component disposed between the display and the housing. The housing includes at least one slit passing through at least a partial area of a first side surface, a lower surface, and a second surface facing the first side surface with a specific width and extending from the first side surface to the second side surface via a first periphery of the lower surface and a second periphery facing the first periphery.

In accordance with another aspect of the present disclosure, a housing is provided. The housing may include a lower surface, a first side surface, a second side surface, and at least one slit passing through at least a partial area of the first side surface, the lower surface, and the second surface facing the first side surface, and extending from the first side surface to the second side surface via a first periphery of the lower surface and a second periphery facing the first periphery. At least one of the first side surface or the second side surface is perpendicular to a periphery of the lower surface.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
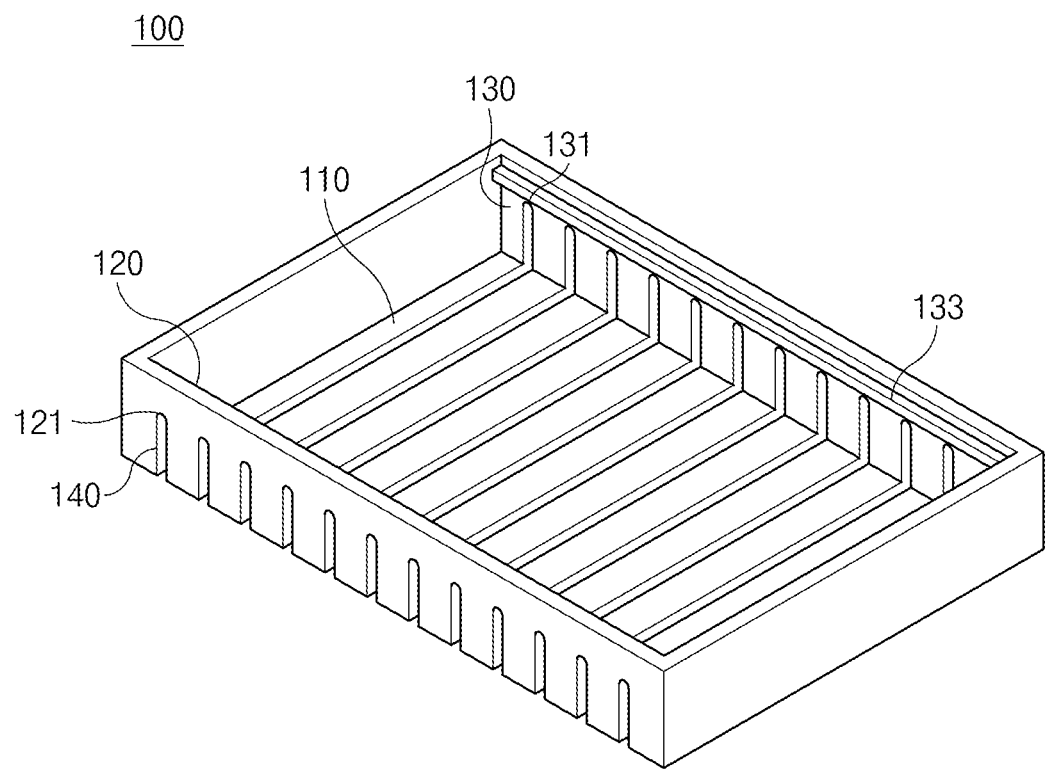
FIG. 1 is a perspective view of a housing according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The term "include," "comprise," and "have", or "may include," or "may comprise" and "may have" used herein indicates disclosed functions, operations, or existence of elements but does not exclude other functions, operations or elements.

For example, the expressions "A or B," or "at least one of A and/or B" may indicate A and B, A, or B. For instance, the expression "A or B" or "at least one of A and/or B" may indicate (1) at least one A, (2) at least one B, or (3) both at least one A and at least one B.

The terms such as "1st," "2nd," "first," "second," and the like used herein may refer to modifying various different elements of various embodiments of the present disclosure, but are not intended to limit the elements. For instance, "a first user device" and "a second user device" may indicate different users regardless of order or importance. For example, a first component may be referred to as a second component and vice versa without departing from the scope and spirit of the present disclosure.

In various embodiments of the present disclosure, it is intended that when a component (for example, a first component) is referred to as being "operatively or communicatively coupled with/to" or "connected to" another component (for example, a second component), the component may be directly connected to the other component or connected through another component (for example, a third component). In various embodiments of the present disclosure, it is intended that when a component (for example, a first component) is referred to as being "directly connected to" or "directly accessed" another component (for example, a second component), another component (for example, a third component) does not exist between the component (for example, the first component) and the other component (for example, the second component).

The expression "configured to" used in various embodiments of the present disclosure may be interchangeably used with "suitable for," "having the capacity to," "designed to," "adapted to," "made to," or "capable of" according to the situation, for example. The term "configured to" may not necessarily indicate "specifically designed to" in terms of hardware. Instead, the expression "a device configured to" in some situations may indicate that the device and another device or part are "capable of." For example, the expression "a processor configured to perform A, B, and C" may indicate a dedicated processor (for example, an embedded processor) for performing a corresponding operation or a general-purpose processor (for example, a central processing unit (CPU) or application processor (AP)) for performing corresponding operations by executing at least one software program stored in a memory device.

All terms used herein may have the same meanings that are generally understood by a person skilled in the art. In general, terms defined in a dictionary should be considered to have the same meanings as the contextual meaning of the related art, and, unless clearly defined herein, should not be understood differently or as having an excessively formal meaning. In any case, even the terms defined in the present specification are not intended to be interpreted as excluding embodiments of the present disclosure.

An electronic device according to various embodiments of the present disclosure may include at least one of a smartphone, a tablet personal computer (PC), a mobile phone, a video telephone, an electronic book reader, a desktop PC, a laptop PC, a netbook computer, a workstation, a server, a personal digital assistant (PDA), a portable multimedia player (PMP), a Motion Picture Experts Group (MPEG-1 or MPEG-2) audio layer 3 (MP3) player, a mobile medical device, a camera, or a wearable device. The wearable device may include at least one of an accessory-type device (e.g., a watch, a ring, a bracelet, an anklet, a necklace, glasses, a contact lens, a head-mounted device (HMD)), a textile- or clothing-integrated-type device (e.g., an electronic apparel), a body-attached-type device (e.g., a skin pad or a tattoo), or a bio-implantable-type device (e.g., an implantable circuit).

In some various embodiments of the present disclosure, an electronic device may be a home appliance. The smart home appliance may include at least one of, for example, a television (TV), a digital video/versatile disc (DVD) player, an audio, a refrigerator, an air conditioner, a cleaner, an oven, a microwave oven, a washing machine, an air cleaner, a set-top box, a home automation control panel, a security control panel, a television (TV) box (e.g., Samsung HomeSync™, Apple TV™, or Google TV™), a game console (e.g., Xbox™ or PlayStation™), an electronic dictionary, an electronic key, a camcorder, or an electronic picture frame.

In other various embodiments of the present disclosure, an electronic device may include at least one of various medical devices (e.g., various portable medical measurement devices (e.g., a blood glucose measuring device, a heart rate measuring device, a blood pressure measuring device, a body temperature measuring device, or the like), a magnetic resonance angiography (MRA), a magnetic resonance imaging (MRI), a computed tomography (CT), a scanner, an ultrasonic device, or the like), a navigation device, a global navigation satellite system (GNSS), an event data recorder (EDR), a flight data recorder (FDR), a vehicle infotainment device, electronic equipment for vessels (e.g., a navigation system, a gyrocompass, or the like), avionics, a security device, a head unit for a vehicle, an industrial or home robot, an automatic teller machine (ATM), a point of sales (POS) device of a store, or an Internet of things (IoT) device (e.g., a light bulb, various sensors, an electric or gas meter, a sprinkler, a fire alarm, a thermostat, a streetlamp, a toaster, exercise equipment, a hot water tank, a heater, a boiler, or the like).

According to various embodiments of the present disclosure, an electronic device may include at least one of a part of furniture or a building/structure, an electronic board, an electronic signature receiving device, a projector, or a measuring instrument (e.g., a water meter, an electricity meter, a gas meter, a wave meter, or the like). An electronic device may be one or more combinations of the above-mentioned devices. An electronic device according to some various embodiments of the present disclosure may be a flexible device. An electronic device according to an embodiment of the present disclosure is not limited to the above-mentioned devices, and may include new electronic devices with the development of new technology.

Hereinafter, an electronic device according to various embodiments of the present disclosure will be described in more detail with reference to the accompanying drawings. The term "user" used herein may refer to a person who uses an electronic device or may refer to a device (e.g., an artificial intelligence electronic device) that uses an electronic device.

Figure 2:
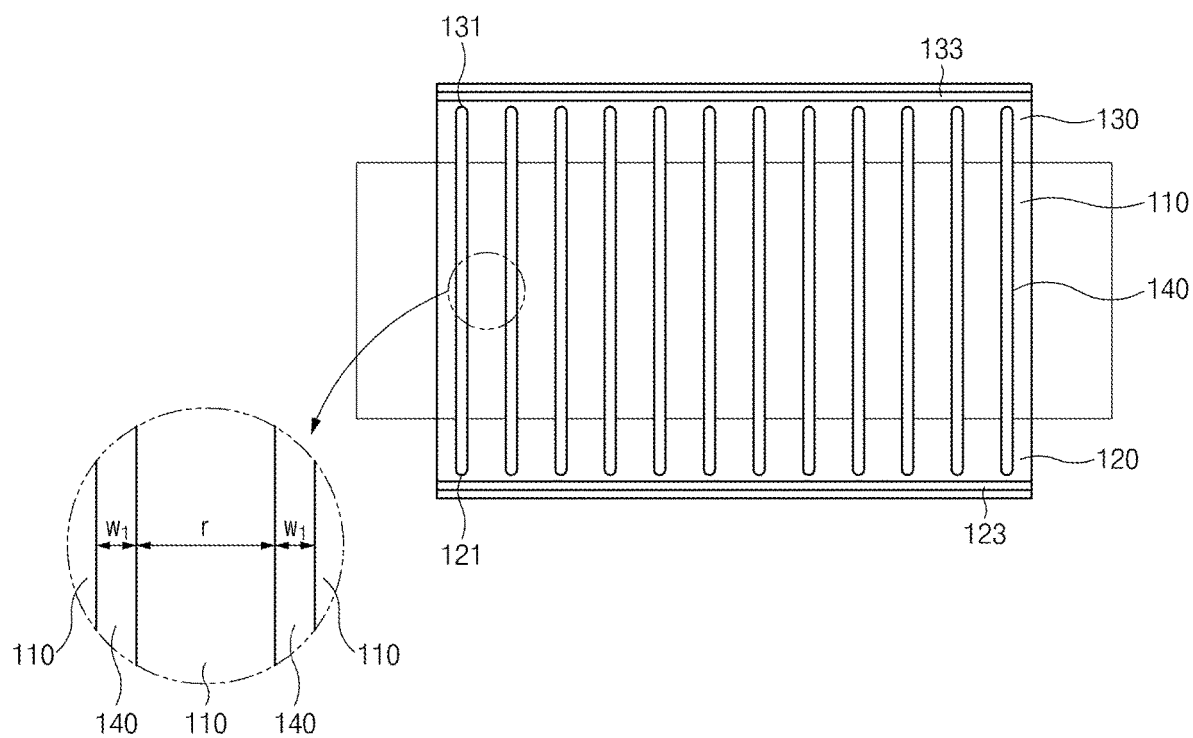
FIG. 2 is a development view of a housing according to an embodiment of the present disclosure.

FIG. 1 is a perspective view of a housing according to an embodiment of the present disclosure. FIG. 2 is a development view of a housing according to an embodiment of the present disclosure.

Referring to FIGS. 1 and 2, the housing 100 may include a lower surface 110 and a side surface extending from a periphery of the lower surface 110 at a specific angle (e.g., vertically). The side surface may include at least a first side surface 120 and a second side surface 130 facing the first side surface 120. At least one surface (e.g., an upper surface) of the housing 100 may be opened, and accordingly, the housing 100 may have an interior space that is opened in at least one direction.

According to an embodiment, the housing 100 may include at least one slit 140. The at least one slit 140 is an element caused by deformation (e.g., curving) of the shape of the housing 100, which will be described below, and may be designed to extend from the first side surface 120 to the second side surface 130 (or from the second side surface 130 to the first side surface 120). For example, the slit 140 may extend from a first point 121 on the first side surface 120 to a lower side of the first side surface 120, and may extend to a second point 131 on the second side surface 130 via the lower surface 110 without a broken area. The first point 121 may be designated to a point that is spaced apart from an upper end of the first side surface 120 downwards (or from a lower end of the first side surface 120 toward the upper side) at a specific interval. The second point 131 also may be designated to an area between an upper end and a lower end of the second side surface 130, and may be designated to a location corresponding to a height of the first point 121 with respect to the lower surface 110.

The at least one slit 140 may pass through at least a partial area of the housing 100. For example, the slit 140 may pass through the first side surface 120, the lower surface 110, and the second side surface 130, and may extend while maintaining a straight line of a specific width (e.g., W1) not to generate an area that is curved on the passing line. In various embodiments, the at least one slit 140 may be formed through a manufacturing process (e.g., injection-molding) of the housing 100.

The adjacent slits 140 may be spaced apart from each other at a specific interval r. The specific interval r may be set to be larger, for example, than the passing width W1 of the slits 140 in consideration of lowering of the durability of the housing 100 due to the slits 140. In various embodiments, the interval r between the slits 140 may be regular or irregular. As mentioned above, because the slits 140 is present due to the deformation (e.g., curving) of the shape of the housing 100, the intervals between the slits 140 may be set to be regular when uniform deformation of the shape of the housing 100 is required. Meanwhile, when different strains are required for some areas of the housing 100, irregular intervals may be formed between the slits 140. In this regard, when the housing 100 is applied as an external appearance of the wearable device, the housing 100 may be adhered to a portion of the body of the user. Then, the body (e.g., a wrist) of the user may include a relatively flat portion (e.g., upper and lower surfaces of the wrist), and a relatively curved portion (e.g., a side surface of the wrist). Accordingly, it is necessary that the shape of the housing 100 cope with irregular curving of the body to increase a mounting feeling of the wearable device. In an embodiment, the interval between the slits 140 may be relatively large in an area of the housing 100 corresponding to a flat portion of the body, and may be relatively small in an area of the housing 100 corresponding to a curved portion of the body.

In various embodiments, brackets 123 and 133 may be formed in at least a partial area of the first side surface 120 or the second side surface 130. For example, the first bracket 123 may protrude to an upper area of the first point 121 of the inner area of the first side surface 120 with a specific area. Similarly, the second bracket 133 may protrude from an inner area of the second side surface 130 to an upper side of the second point 131. When the housing 100 are applied as an external appearance of the electronic device, the brackets 123 and 133 may function to support an element (e.g., the display) of the electronic device, which is mounted in an interior space of the housing 100.

Figure 3:
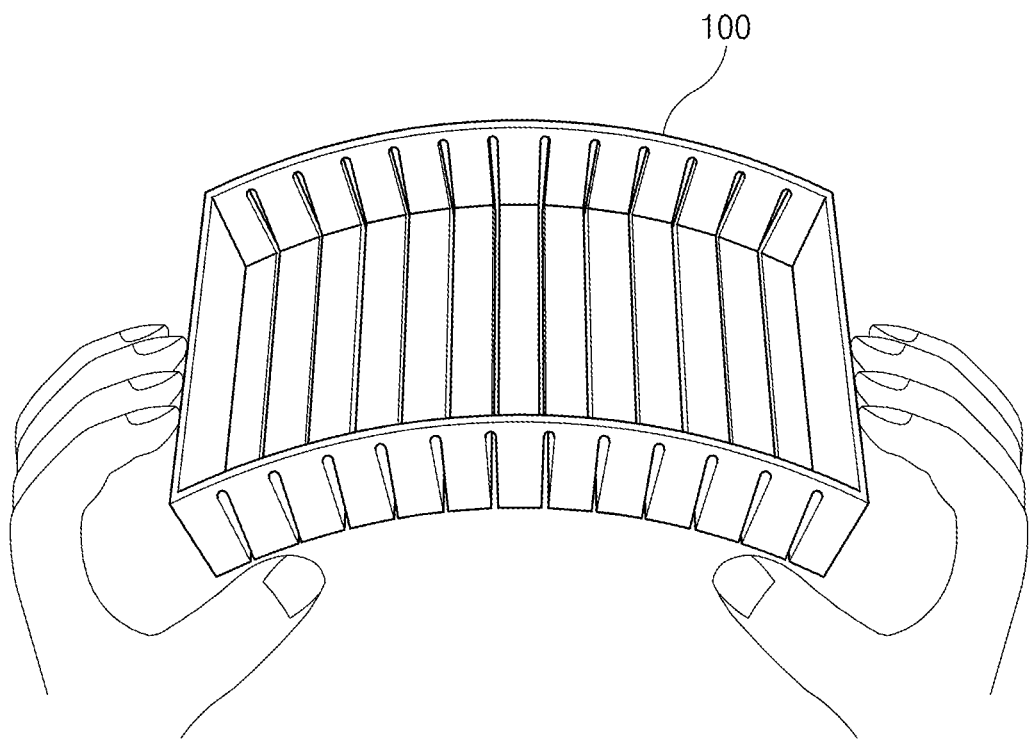
FIG. 3 is a view illustrating an example in which a shape of a housing is deformed in correspondence to an external pressure according to an embodiment of the present disclosure.
Figure 4:
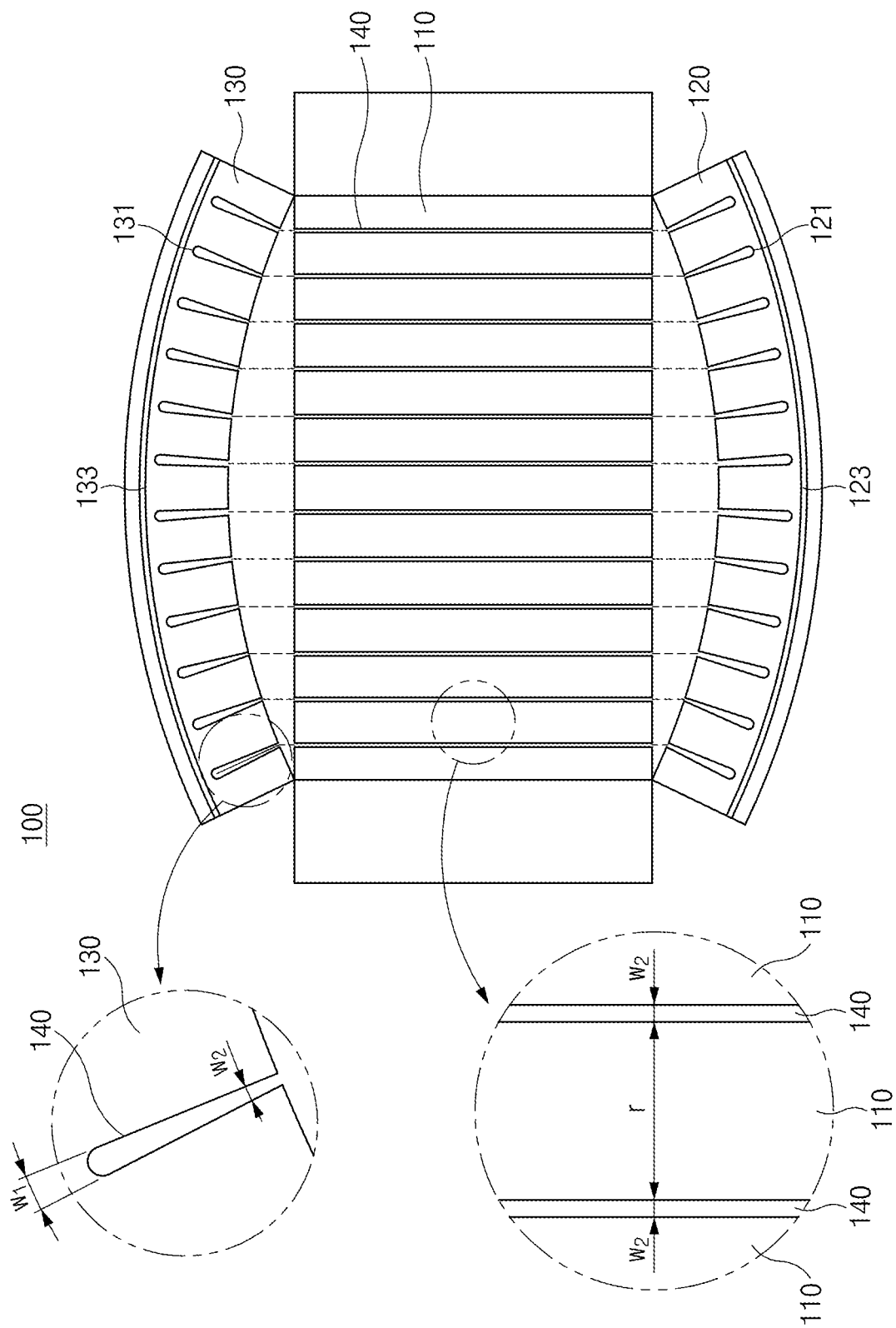
FIG. 4 is a development view of a housing, a shape of which is deformed, according to an embodiment of the present disclosure.

FIG. 3 is a view illustrating an example in which a shape of a housing is deformed in correspondence to an external pressure according to an embodiment of the present disclosure. FIG. 4 is a development view of a housing, a shape of which is deformed, according to an embodiment of the present disclosure.

Referring to FIGS. 3 and 4, the shape of the housing 100 may be deformed when a force is applied from the outside to the housing 100. For example, the housing 100 may be curved at a specific size toward the upper side or the lower side according to a direction in which the force is applied. In this regard, at least a partial area (e.g., the lower surface 110, the first side surface 120, the second side surface 130, or the brackets 123 and 133) of the housing 100 may include a flexible material.

The deformation of the shape of the housing 100 may be related to the deformation of the width of the at least one slit 140. In this regard, because the at least one slit 140 is opened in at least a partial area of the lower surface 110, the first side surface 120, or the second side surface 130, the strength of the area corresponding to the slit 140 may be relatively low as compared with an area that is not opened (or an area in which the slit 140 is not formed) when an external force is not applied to the housing 100. Accordingly, a relatively high external force may be applied to an area in which the at least one slit 140 is formed, and the width of at least a partial area of the at least one slit 140 may become smaller. Then, because an area of the first point 121 or the second point 131 for the at least one slit 140 is closed, the widths of the lower area with respect to the first point 121 or the second point 131 and an area of the lower surface 110 may become smaller. For example, the width of the slit 140 of the area of the lower surface 110 may be changed from an initial first width W1 to a second width W2 that is smaller than the first width W1. Further, the areas of the lower surface 110, in which the slit 140 is not formed, may be completely combined with each other according to an external pressure, and in this case, the width of the slit 140 in the area of the lower surface 110 may not be formed. At least a partial area of the width of the slit 140 formed in an area of the first side surface 120 or the second side surface 130 may be changed to the second width W2 in correspondence to the deformation of the width of the slit 140. For example, the width of the slit 140 of the area of the first side surface 120 or the second side surface 130 may gradually change from the first width W1 to the second width W2 as it goes toward the lower end of the first side surface 120 or the lower end of the second side surface 130 with respect to the first point 121 or the second point 131. The housing 100 may be curved by deforming at least a partial area of the lower surface 110, the first side surface 120, or the second side surface 130 in correspondence to the change of the width of the slit 140.

Figure 5:
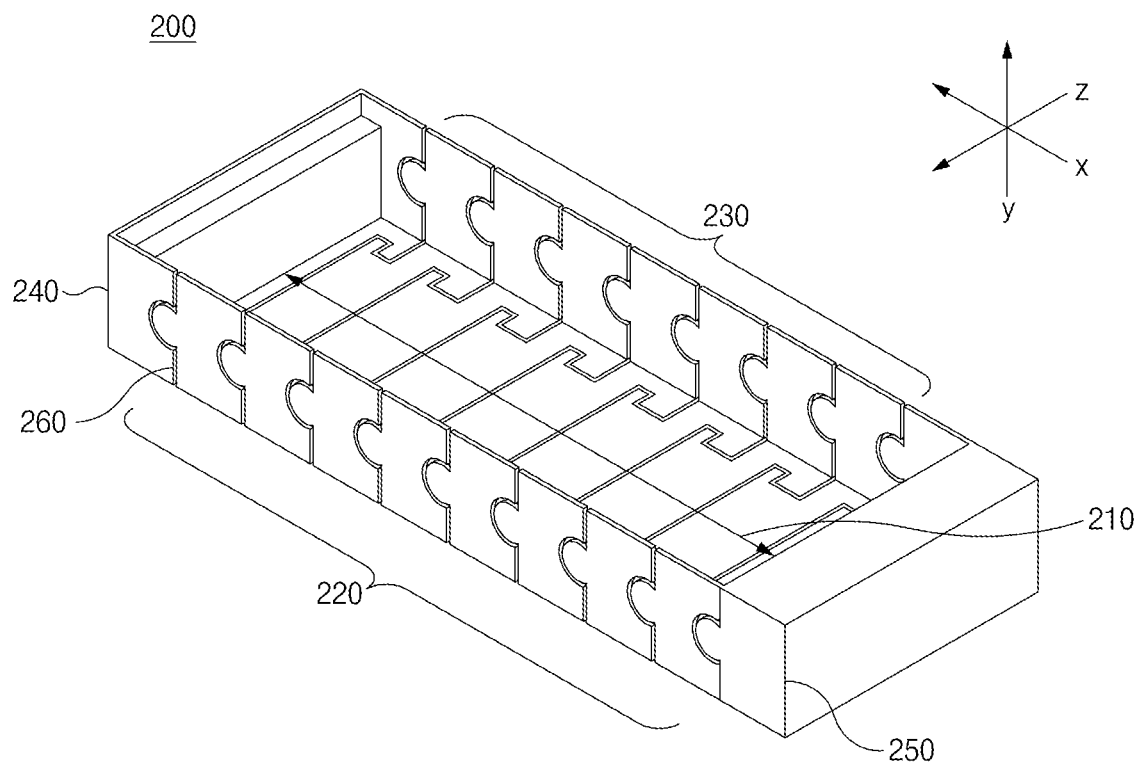
FIG. 5 is a perspective view of a housing according to another embodiment of the present disclosure.
Figure 6:
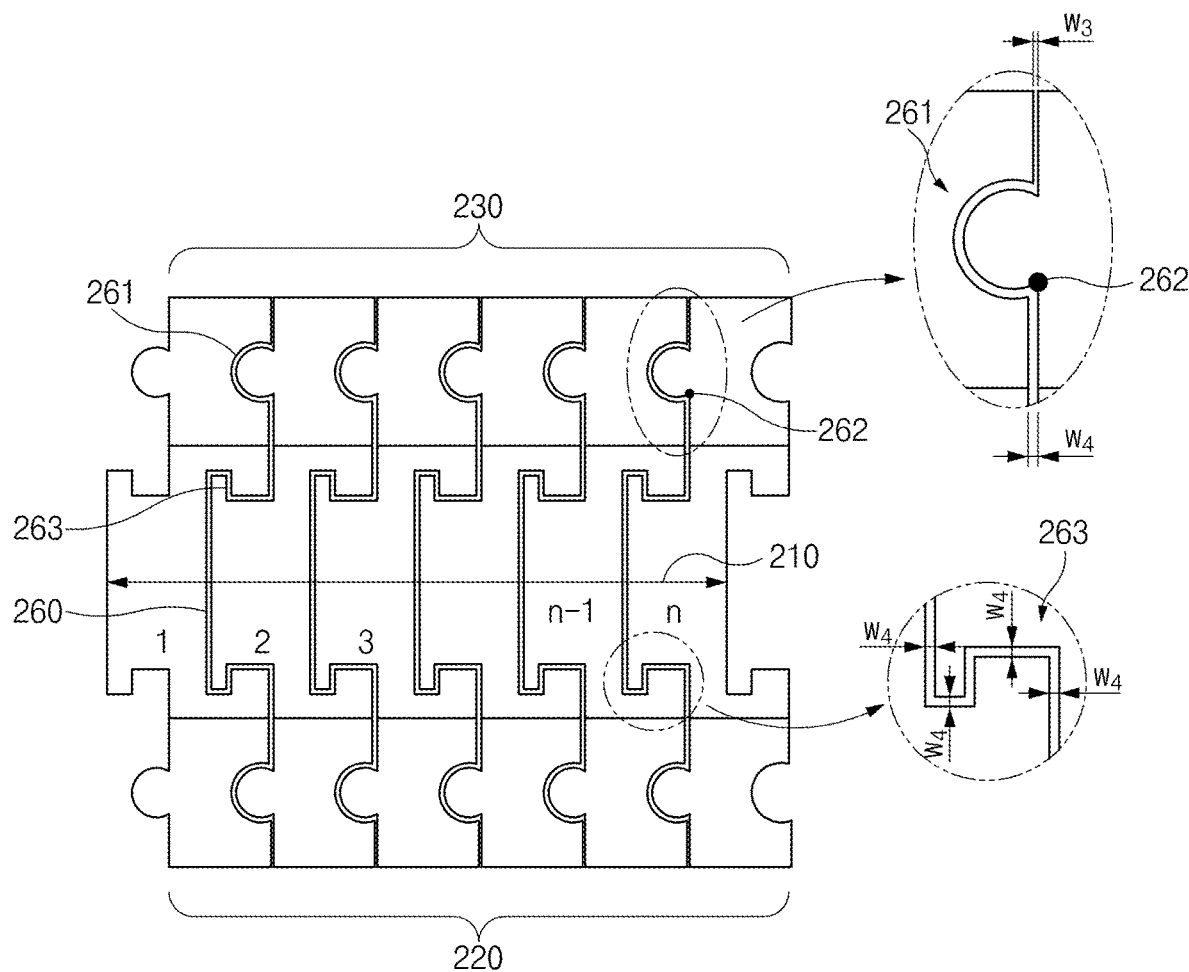
FIG. 6 is a development view of a housing according to another embodiment of the present disclosure.

FIG. 5 is a perspective view of a housing according to another embodiment of the present disclosure. FIG. 6 is a development view of a housing according to another embodiment of the present disclosure.

Referring to FIGS. 5 and 6, the housing 200 may include a lower surface 210 and a first side surface 220 and a second side surface 230 extending from a periphery of the lower surface 210 at a specific angle (e.g., vertically). The first side surface 220 and the second side surface 230 may face each other. At least one side cap 240 and 250 may be coupled to an opened side surface other than the first side surface 220 and the second side surface 230. The at least one side cap 240 and 250 may be attached to or detached from the first side surface 220 or the second side surface 230. The side cap 240 and 250 will be described in detail with reference to FIG. 7.

At least one slit 260 may be formed in at least a partial area of the lower surface 210, the first side surface 220, or the second side surface 230 of the housing 200. In the housing 200 according to another embodiment, the at least one slit 260 may extend from a peripheral area of the upper end of the first side surface 220 to a lower side of the first side surface 220, and may extend to a peripheral area of the upper end of the second side surface 230 via the lower surface 210 without a broken area. In various embodiments, the at least one slit 260 may be formed through a manufacturing process (e.g., computer numerical control (CNC) forming) of the housing 200 through laser cutting. Then, the at least one slit 260 may be cut to includes at least one first pattern 261 or at least one second pattern 263.

Because the at least one slit 260 extends from or to a peripheral area of the upper end of the first side surface 220 or the second side surface 230, the housing 200 may be physically separated (e.g., 1, 2, ..., n-1, n). In an embodiment, the separated housing 200 may be coupled into one part by the first pattern 261 or the second pattern 263. In this regard, the first pattern 261 may be formed while having curving in the x-axis direction in a central area between an upper end periphery and a lower end periphery of the first side surface 220 or the second side surface 230. The separated parts (e.g., 1, 2, ..., n-1, n) of the housing 200 may be engaged with each other based on the curved shape of the first pattern 261, and accordingly, the parts (e.g., 1, 2, ..., n-1, n) may be prevented from being separated in the x-axis direction. The second pattern 263 may be cut while forming an uneven part in the z-axis direction in at least a partial area of the lower surface 210. The parts (e.g., 1, 2, ..., n-1, n) of the housing 200 may be engaged with each other based on the uneven part of the second pattern 263 together with the curved shape of the first pattern 261. The second pattern 263 may prevent the parts (e.g., 1, 2, ..., n-1, n) from being separated in the z-axis direction.

In an embodiment, the at least one slit 260 may extend from a peripheral area of the upper end of the first side surface 220 or the second side surface 230 to the first point 262 of the first pattern 261 with the first width W3. Further, the at least one slit 260 may extend from the first point 262 designated on the first side surface 220 to the first point 262 designated on the second side surface 230 via the lower surface 210 with a second width W4 that is larger than the first width W3 by a specific size.

Figure 7:
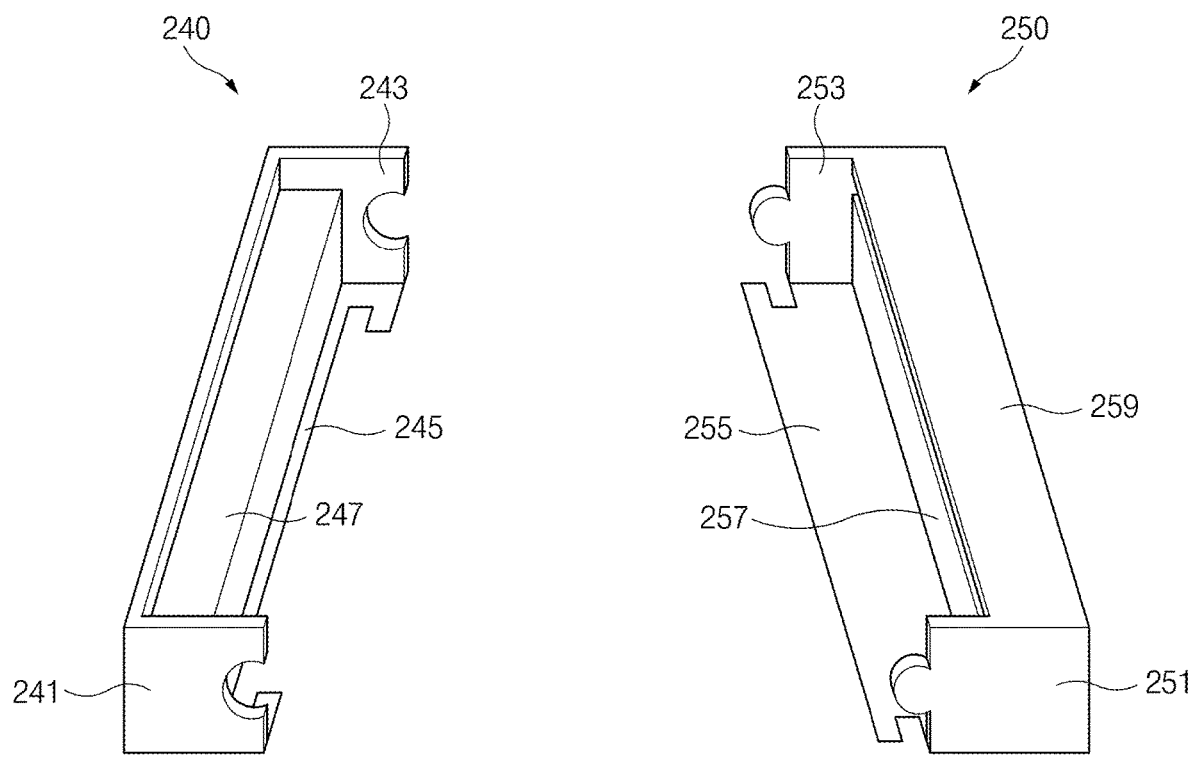
FIG. 7 is a view illustrating first and second side caps according to another embodiment of the present disclosure.

FIG. 7 is a view illustrating first and second side caps according to another embodiment of the present disclosure.

Referring to FIG. 7, the first side cap 240 and the second side cap 250 may correspond to the shape of a transverse periphery of the lower surface 210, the first side surface 220, or the second side surface 230, which is fastened. For example, the shape of the first terminal end 241 or the second terminal end 243 of the first side cap 240 (or the shape of the first terminal end 251 or the second terminal end 253 of the second side cap 250) may have a shape corresponding to the curving to be engaged with the curving of the first pattern 261 (see FIG. 6). Further, the shape of the lower end 245 of the first side cap 240 (or the shape of the lower end 255 of the second side cap 250) may have a shape corresponding to the uneven part of the second pattern 263 (see FIG. 6).

In various embodiments, the first side cap 240 or the second side cap 250 may include a stepped surface 247 and 257 protruding from at least a partial area thereof with a specific size. When the housing 200 is applied as an external appearance of the electronic device, the stepped surface 247 and 257 may support an element (e.g., the display) mounted in the interior space of the electronic device. In various embodiments, a shield surface 259 that at least partially shields an upper area of the stepped surface 257 may be formed in the second side cap 250.

Figure 8:
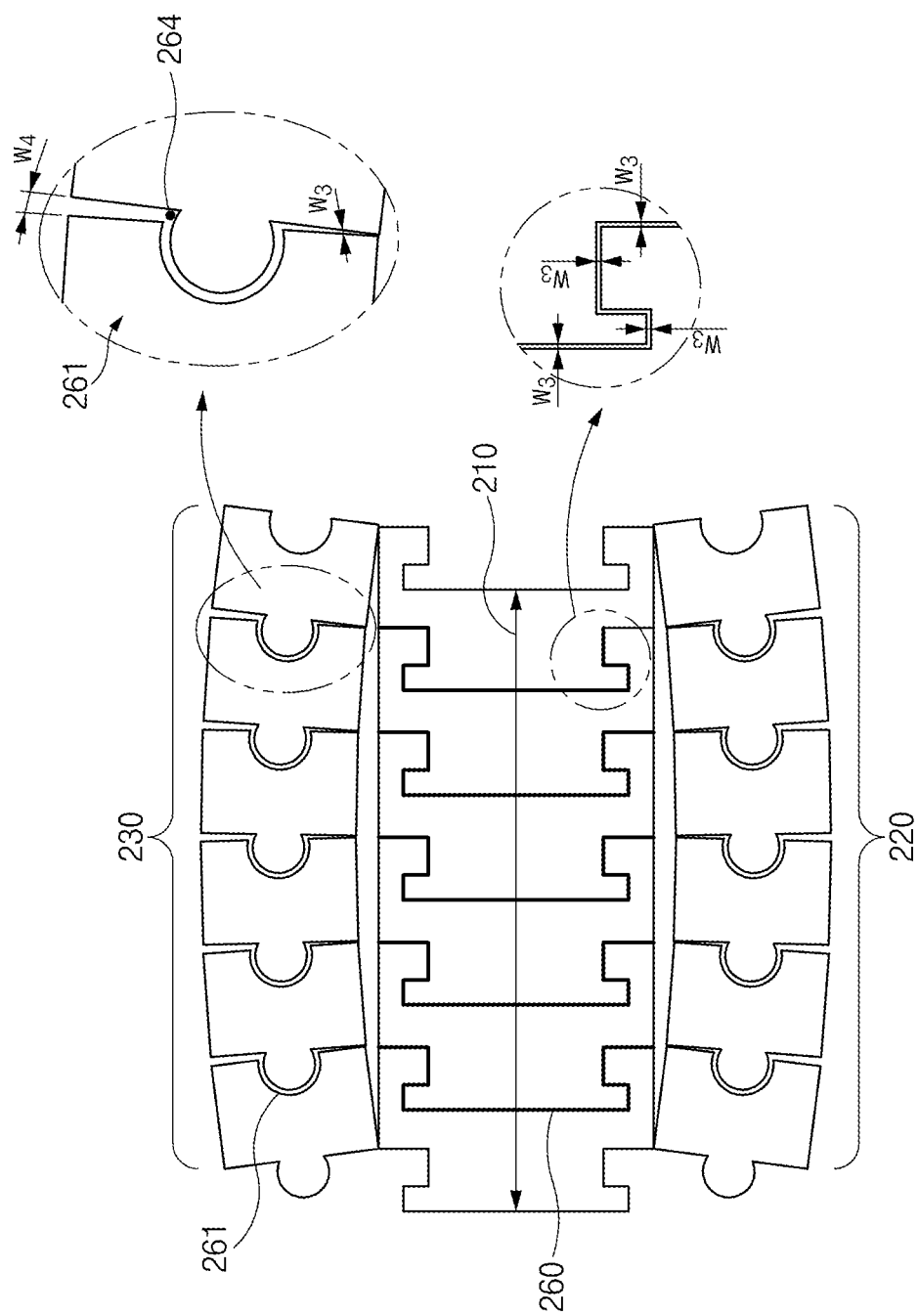
FIG. 8 is a development view of a housing, a shape of which is deformed, according to another embodiment of the present disclosure.

FIG. 8 is a development view of a housing, a shape of which is deformed, according to another embodiment of the present disclosure.

When an external force is applied to the housing 200, the width of the at least one slit 260 is changed so that the shape of the first side surface 220 or the second side surface 230 may be deformed. As mentioned above, because the upper and lower widths of the at least one slit 260 formed in the first side surface 220 and the second side surface 230 with respect to a first point 262 (see FIG. 6) designated in the first pattern 261, the curving of the first pattern 261 may be applied as an axis in relation to the operation of the applied external force. Accordingly, if the external force is applied, the width of an upper side of the slit 260 formed on the first side surface 220 or the second side surface 230 with respect to the second point 264 may be changed from the initial first width W3 to the second width W4 that is larger than the first width W3 by a specific size. Correspondingly, the width of a lower side of the slit 260 with respect to the second point 264 may be changed from the second width W4 to the first width W3, and the width of the lower surface 210 connected to a lower width of the second point 264 also may be changed from the second width W4 to the first width W3. At least a portion of the shape of the lower surface 210, the first side surface 220, or the second side surface 230 may be curved due to the change of the width of the at least one slit 260.

Figure 9:
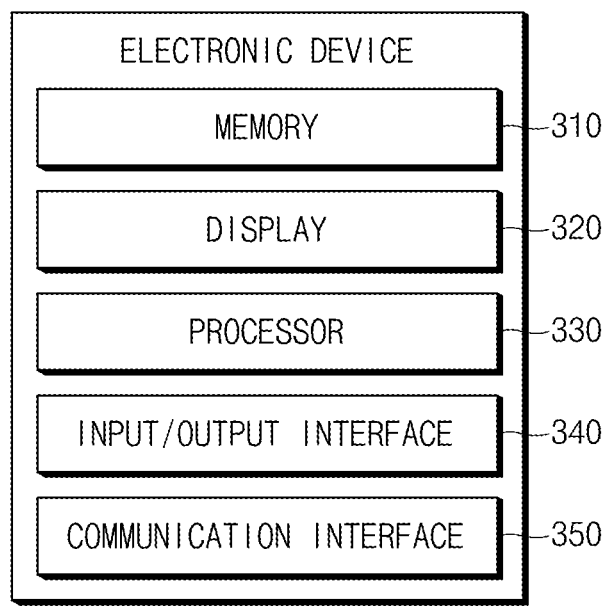
FIG. 9 is a view illustrating a configuration of an electronic device according to an embodiment of the present disclosure.

FIG. 9 is a view illustrating a configuration of an electronic device according to an embodiment of the present disclosure.

Referring to FIG. 9, the electronic device 300 may include a memory 310, a display 320, a processor 330 (e.g., at least one processor), an input/output interface 340, or a communication interface 350 (e.g., a transceiver). In some embodiments, the electronic device 300 may exclude at least one of the elements or may additionally include another element.

The memory 310 may store at least one of a command and data related to at least one element of the electronic device 300. Further, the memory 310 may store at least one of software and a program. In various embodiments, the memory 310 may include at least one of a volatile memory (e.g., a dynamic random-access memory (DRAM), a static RAM (SRAM), a synchronous DRAM (SDRAM), or the like) or a non-volatile memory (e.g., a one-time programmable read only memory (OTPROM), a programmable ROM (PROM), an erasable and programmable ROM (EPROM), an electrically erasable and programmable ROM (EEPROM)), a mask ROM, a flash ROM, and a flash memory.

The display 320 may display various content (e.g., a text, an image, a video, an icon, and a symbol). The display 320 may be disposed in an inner space of the housing 100 (see FIG. 1) or 200 (see FIG. 5). In various embodiments, the display 320, for example, may include a liquid crystal display (LCD), a light emitting diode (LED) display, an organic LED (OLED) display, a microelectromechanical system (MEMS) display, or an electronic paper display.

The processor 330 may control at least one element of the electronic device 300. For example, the processor 330 control a plurality of hardware or software elements connected to the processor 330 by driving an operating system or an application program. Further, the processor 330 may perform calculations or data processing related to communication of at least one element of the electronic device 300. In various embodiments, the processor 330 may include at least one of a central processing unit (CPU), an application processor (AP), or a communication processor (CP).

The input/output interface 340 may deliver a command and data input by the user or from another external device to the elements of the electronic device 300. The input/output interface 340 may output a command or data received from other elements of the electronic device to the user or anther external device.

The communication interface 350 may set communication between the electronic device 300 and an external device. For example, the communication interface may be connected to a network through wireless or wired communication to communicate with the external device. In various embodiments, the wireless communication may include at least one of long-term evolution (LTE), LTE-advanced (LTE-A), code division multiple access (CDMA), wideband CDMA (WCDMA), a universal mobile telecommunications system (UMTS), wireless broadband (WiBro), or a global system for mobile communications (GSM). Further, the wireless communication may include short range communications, such as Wi-Fi, Bluetooth, near field communication (NFC), and magnetic stripe transmission (MST).

Figure 10:
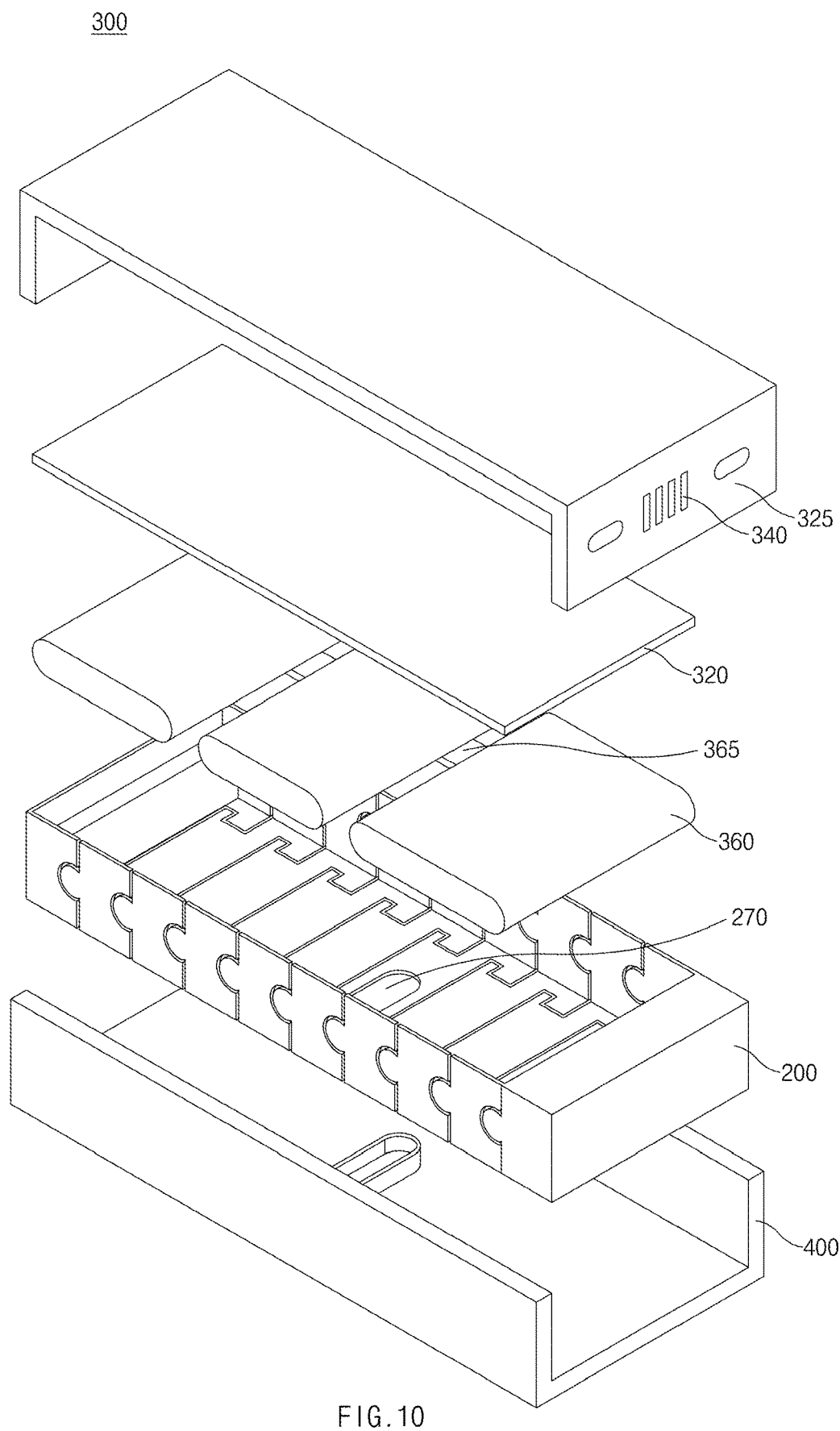
FIG. 10 is an exploded perspective view of an electronic device according to an embodiment of the present disclosure.

FIG. 10 is an exploded perspective view of an electronic device according to an embodiment of the present disclosure.

As illustrated in FIG. 10, the cover glass 325, the display 320, the at least one electronic component module 360, and the housing 200 may be may be sequentially mounted on the electronic device 300.

The cover glass 325 may be disposed on the display 320 to transmit light generated by the display 320. In an embodiment, the cover glass 325 may shield the opened upper side of the housing 200, and may extend to cover at least one side surface (e.g., a side surface on which a slit is not formed). In various embodiments, the cover glass 325 may include a touch screen, and at least one of a touch, a gesture, a proximity, or a hovering input by using an electronic pen or a part of the body of the user may be applied to the cover glass 325. Further, in various embodiments, a connector hole 340 for electrical connection of a connector (not illustrated) and an external device provided in the electronic device 300 may be formed in at least a partial area (e.g., an extended area) of the cover glass 325.

The display 320 may be disposed in the interior space of the housing 200. For example, the display 320 may be fixed to any one of the stepped surfaces 247 and 257 formed in the first side cap 240 (see FIG. 7) and the second side cap 250 (see FIG. 7) of the housing 200 to be supported by another one.

The at least one electronic component module 360 may be constituted by packaging at least some (e.g., the memory 310 or the processor 330) of the elements of the electronic device 300 described with reference to FIG. 9 in a functional unit or through a specific combination. In addition, the electronic component module 360 may include a printed circuit board, a battery, or at least one sensor (e.g., a biometric signal detecting sensor). In various embodiments, the at least one electronic component module 360 may be spaced apart from another electronic component module 360 at a specific interval. Because the at least one electronic component module 360 may cope with the deformation of the shape of the housing 200 when it is disposed densely, it may be formed with another electronic component module 360 at a specific interval in consideration of the strain of the housing. In various embodiments, the at least one electronic component module 360 may be electrically connected to another electronic component module 360 based on at least one conductive member 365. Further, the electronic component module 360 may be electrically connected to the display 320 through the conductive member 365. In various embodiments, the at least one electronic component module 360 may be coupled to a flexible frame (not illustrated) formed in the interior space of the housing 200 to be supported or fixed.

The housing 200 may be the same as or similar to the housing 100 or 200 according to various embodiments with reference to FIGS. 1 to 8. Although FIG. 10 illustrates that the housing 200 has a pattern type slit structure with slits 260 (see FIG. 5), it may have a linear slit structure with slits 140 (see FIG. 1) instead. In various embodiments, a sensor window 270 related to performance of the function of the electronic component module 360 including at least one sensor may be formed in at least a partial area of the housing 200.

In various embodiments, the electronic device 300 may further include a first cover accessory 400. The first cover accessory 400 may protect at least one element related to the housing 200 or the electronic device 300 from the outside. Further, as the first cover accessory 400 covers an external appearance of the housing 200, it may prevent foreign substances from being introduced into the electronic device 300 through a slit formed in the housing.

In various embodiments, the cover glass 325, the display 320, or the first cover accessory 400, which has been described above, may include at least a portion of a flexible material such that at least a partial area thereof is curved in correspondence to the deformation of the shape of the housing 200.

Figure 11:
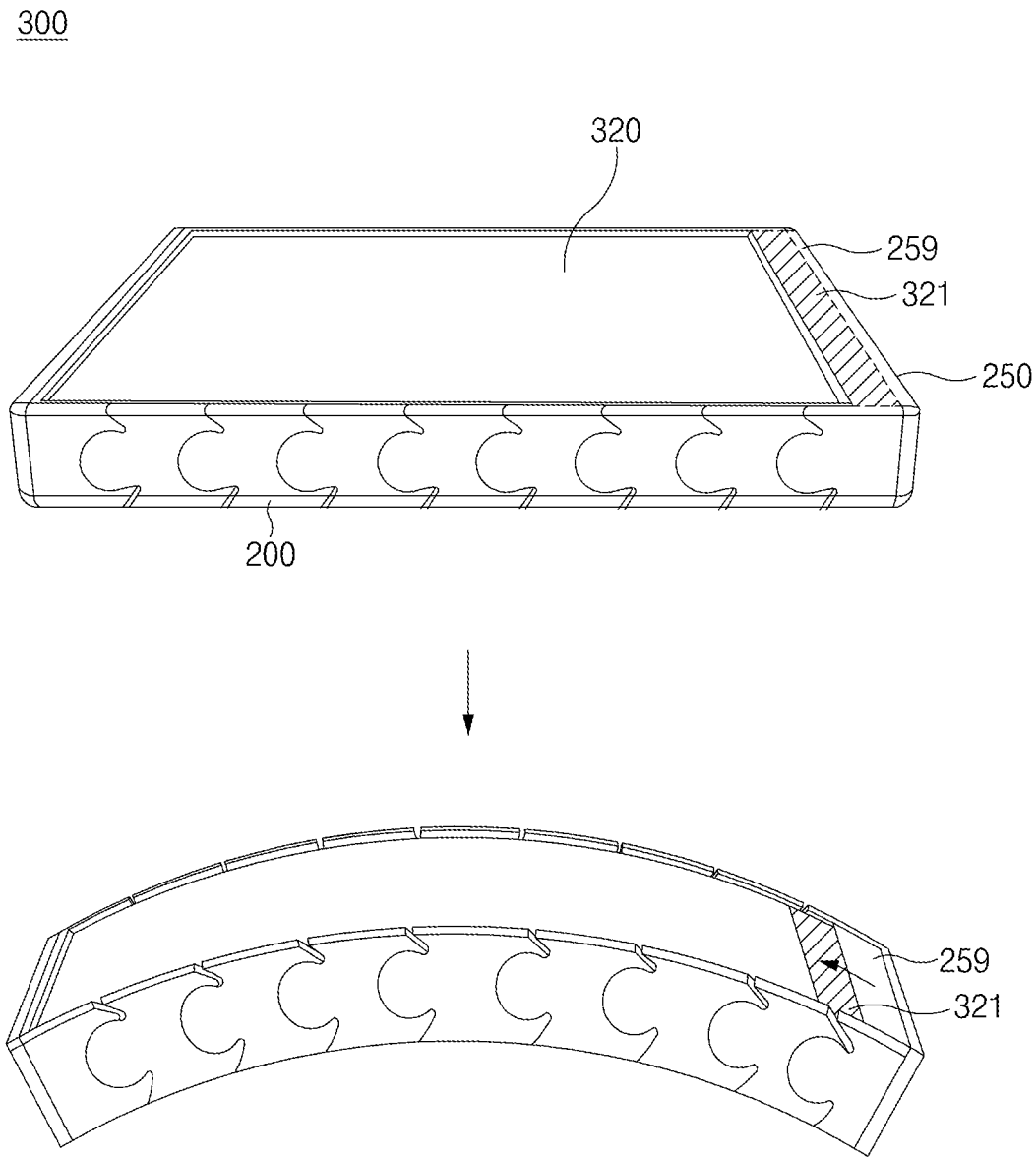
FIG. 11 is a view illustrating structural deformation of a display corresponding to deformation of a shape of an electronic device according to an embodiment of the present disclosure.

FIG. 11 is a view illustrating structural deformation of a display corresponding to deformation of a shape of an electronic device according to an embodiment of the present disclosure.

The deformation of the shape of the housing 200 may be associated with the deformation of the shape of the display 320. Then, the strains of the housing 200 and the display 320 are neither the same nor similar, damage or lowering of the function of the display 320 may be caused. Accordingly, in an embodiment, one end of the display 320 disposed in the interior space of the housing 200 is fixed to a stepped surface 247 of the first side cap 240 (see FIG. 7), and an opposite end 321 thereof may be simply supported by the stepped surface 257 of the second side cap 250 (see FIG. 7). As illustrated in FIG. 11, at least a partial area of the opposite end 321 may be shielded by a shield surface 259 formed in the second side cap 250.

In an embodiment, when at least a partial area of the display 320 is curved in correspondence to the deformation of the shape of the housing 200, an end of the display 320 fixed to the stepped surface 247 of the first side cap 240 may pull an opposite end 321 of the display 320 supported by the stepped surface 257 of the second side cap 250. Accordingly, the opposite end 321 of the display 320 may be exposed to the outside of the shield surface 591 of the second side cap 250 while being slid in a pulling direction.

Figure 12:
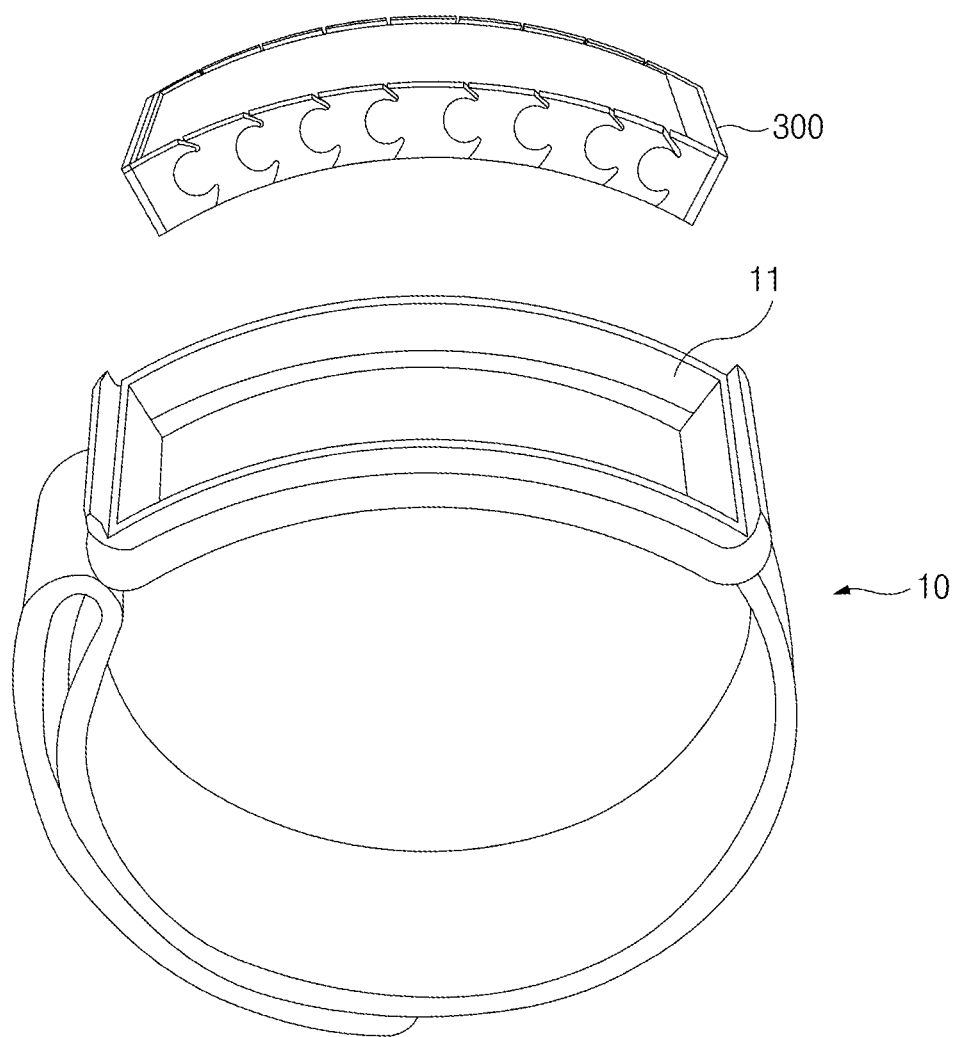
FIG. 12 is a view illustrating an example in which an electronic device is accommodated in a cover accessory according to an embodiment of the present disclosure.
Figure 13:
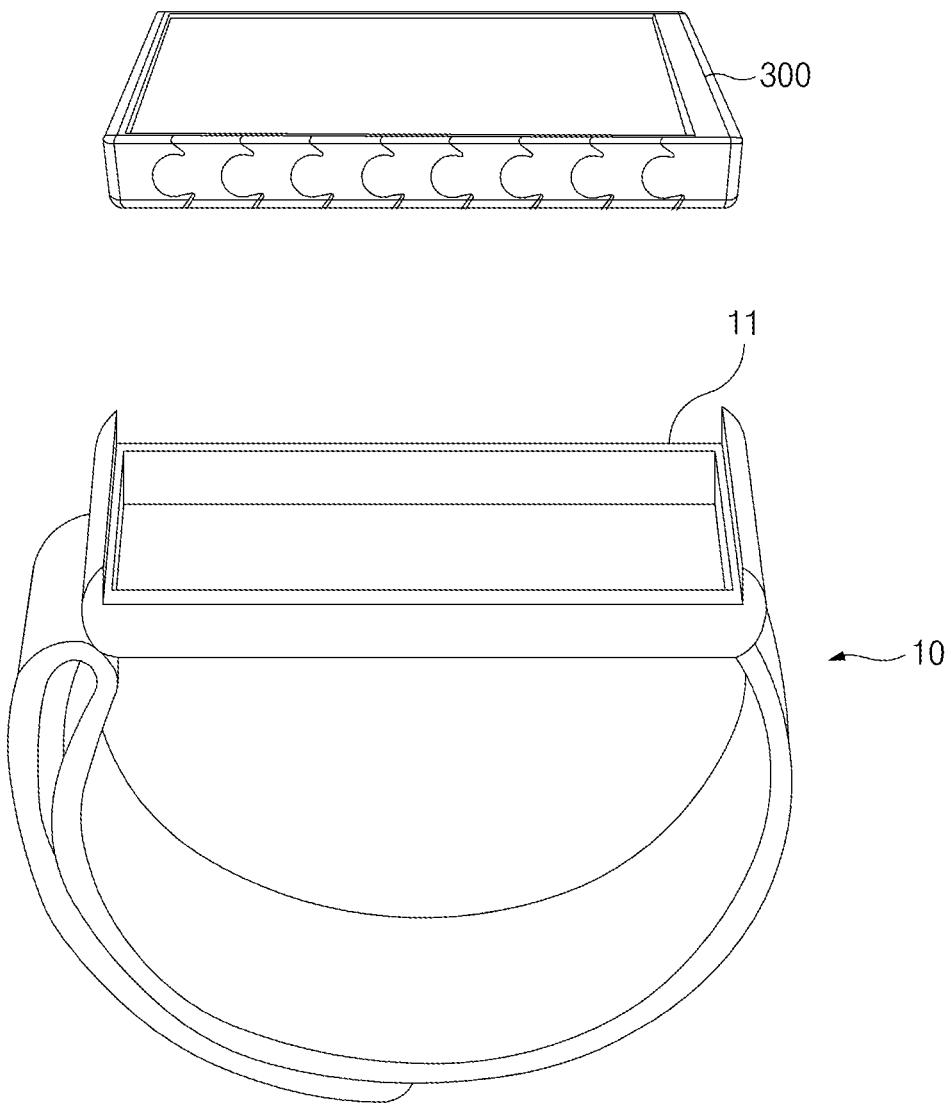
FIG. 13 is a view illustrating another example in which an electronic device is accommodated in a cover accessory according to an embodiment of the present disclosure.

FIGS. 12 and 13 are views illustrating various examples in which an electronic device is accommodated in a cover accessory according to various embodiments of the present disclosure.

In an embodiment, the electronic device 300 may be accommodated in the second cover accessory 10 in a wearable type, in addition to the first cover accessory 400 (see FIG. 10).

Referring to FIGS. 12 and 13, the electronic device 300 may be accommodated or fixed in the bracket 11 formed in the second cover accessory 10 in relation to the operation of the wearable device. Then, as illustrated in FIG. 12, the bracket 11 may be formed in a curved structure corresponding to the deformed electronic device 300. Further, the bracket 11 may have a flat structure as in FIG. 13, and at least a partial area of the bracket 11 may include an elastic material. Accordingly, the bracket 11 may accommodate the electronic device 300, the shape of which is not deformed (or flat) and may accommodate the electronic device, the shape of which is deformed by using an elastic material.

According to various embodiments, a housing may include a lower surface, a first side surface, a second side surface, and at least one slit passing through at least a partial area of the first side surface, the lower surface, and the second side surface facing the first side surface, and extending from the first side surface to the second side surface via a first periphery of the lower surface and a second periphery facing the first periphery.

According to various embodiments, wherein at least one of the first side surface or the second side surface is perpendicular to a periphery of the lower surface.

According to various embodiments, an electronic device may include a housing including at least one open surface, a display disposed in an interior space of the housing, at least a portion of the display is exposed through the open surface of the housing, and at least one electronic component disposed between the display and the housing.

According to various embodiments, the housing may include at least one slit passing through at least a partial area of a first side surface, a lower surface, and a second surface facing the first side surface with a specific width and extending from the first side surface to the second side surface via a first periphery of the lower surface and a second periphery facing the first periphery.

According to various embodiments, when an external force is applied to the electronic device, at least a portion of the first side surface, the lower surface, or the second side surface of the housing may be deformed to be curved while a width of at least a partial area of the at least one slit becomes smaller.

According to various embodiments, the at least one slit may form at a regular interval or an irregular interval with another adjacent slit.

According to various embodiments, the at least one slit may extend from a first point designated in an area between an upper end and a lower end of the first side surface to a second point of the second side surface, wherein the second point designated to have a height corresponding to the first point.

According to various embodiments, the at least one slit may include a first width, and when an external force is applied to the electronic device, a first width of the lower surface may be changed to a second width that is smaller than the first width by a specific size, and at least a portion of the first width of the first side surface or the second side surface may be changed to the second width in correspondence with the change of the first width of the lower surface.

According to various embodiments, the at least one slit may divide the housing into a plurality of parts while extending from an upper periphery of the first side surface to an upper periphery of the second side surface.

According to various embodiments, the at least one slit may include at least one first pattern having a curve in at least a partial area of the first side surface or the second side surface, and at least one second pattern having an uneven part in at least a partial area of the lower surface.

According to various embodiments, the housing may be formed by engaging the plurality of parts based on a curved structure of the first pattern and the second pattern of the at least one slit.

According to various embodiments, the at least one slit may be formed in a first area including an area from the upper peripheries of the first side surface and the second side surface to a first point of the first pattern formed on each of the side surfaces with a first width, and the at least one slit may have a second width that is larger than the first width by a specific size in a second area including an area from the first point of the first pattern formed on the first side surface to the first point of the first pattern formed on the second side surface via the first periphery and the second periphery of the lower surface.

According to various embodiments, in the at least one slit, when a force is applied from the outside, a second width of the second area may be changed to a first width and at least a portion of the first width of the first area may be changed to a second width in correspondence to the change of the width of the second area.

According to various embodiments, the housing may further include at least one side cap that covers opposite sides of the first side surface and the second side surface.

According to various embodiments, the at least one side cap may include a first side cap, at least a partial area of the first side cap is coupled to a first end of the display, and a second side cap configured to shield at least a portion of an upper area for a second end of the display opposite the first end of the display.

According to various embodiments, each of the first side cap and the second side cap may include a stepped surface for supporting the display, in at least a partial area thereof.

According to various embodiments, the display may at least partially include a flexible material such that at least a partial area thereof is curved in correspondence with the deformation of a shape of the housing.

According to various embodiments, when at least a partial area of the display is curved, the first end of the display fixed to the first side cap may pull the second end of the display shielded by the second side cap, and at least a portion of the second end of the display in the shielded area may be exposed while being slid in correspondence with the pulling of the first end of the display.

According to various embodiments, the electronic component may include at least one module packaged in a functional device or in a specific combination.

According to various embodiments, the at least one module may be configured to spaced apart from another adjacent module by a specific interval not to act against the deformation of the shape of the lower surface of the housing, and may be electrically connected to the other module and the display based on at least one conductive member.

According to various embodiments, the electronic device may include a cover glass covering at least a partial area of the display, and the cover glass may extend to cover at least one side surface, except for the first side surface and the second side surface.

According to various embodiments, the cover glass may include a connector hole in which an external device is connected to at least a partial area thereof.

According to various embodiments, the operation efficiency in a flexible environment may be improved by deforming the shape of the electronic device in correspondence to an external force.

In addition, the present disclosure may provide various effects that are directly or indirectly recognized.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
    a housing including:
        a first surface,
        a second surface opposite to the first surface,
        a side surface defined between the first surface and the second surface, and
        a plurality of slits formed on the second surface of the housing and extending to a portion of the side surface of the housing;
    a display forming the first surface of the housing;
    an electronic component disposed within the housing and including a sensor;
    a sensor window formed on the second surface of the housing and formed between any one of the plurality of slits and another one adjacent thereto;
    a first side cap coupled to a first end of the display; and
    a second side cap configured to support a second end of the display opposite the first end of the display,
    wherein, when at least a partial area of the display is curved, the first end of the display fixed to the first side cap pulls the second end of the display, and the display slides in the direction of the first side cap, and
    wherein the sensor is configured to be exposed through the sensor window to the second surface of the housing.

2. The electronic device of claim 1, wherein, when an external force is applied to the electronic device, at least a portion of the side surface and the second surface of the housing is deformed to be curved while a width of each of the plurality of slits becomes smaller.

3. The electronic device of claim 1, wherein each of the plurality of slits forms a regular interval with another adjacent slit.

4. The electronic device of claim 1,
    wherein the plurality of slits divide the housing into a plurality of parts, and
    wherein the plurality of parts are connected to each other to form a periphery surrounding the display.

5. The electronic device of claim 4, wherein the plurality of slits includes:
    at least one first pattern having a curve in at least a partial area of the first surface or the second surface; and
    at least one second pattern having an uneven part in at least a partial area of a lower surface.

6. The electronic device of claim 5, wherein the housing is formed by engaging the plurality of parts based on a curved structure of the first pattern and the second pattern of the plurality of slits.

7. The electronic device of claim 5, wherein the plurality of slits is formed in a first area including an area from the upper peripheries of the first surface and the second surface to a first point of the first pattern formed on each of the first surface and the second surface with a first width, and
    wherein the plurality of slits has a second width that is larger than the first width by a size in a second area including an area from the first point of the first pattern formed on the first surface to the first point of the first pattern formed on the second surface via a first periphery and a second periphery of the lower surface.

8. The electronic device of claim 7, wherein, in the plurality of slits, when a force is applied from the outside, a second width of the second area is changed to a first width and at least a portion of the first width of the first area is changed to a second width in correspondence to the change of the width of the second area.

9. The electronic device of claim 1, wherein the electronic component includes: at least one module packaged in a functional device or in a combination.

10. The electronic device of claim 9, wherein the at least one module is configured to be: spaced apart from another adjacent module by an interval not to act against the deformation of the shape of a lower surface of the housing, and electrically connected to the other module and the display based on at least one conductive member.

11. The electronic device of claim 1, further comprising: a cover glass covering at least a partial area of the display, wherein the cover glass extends to cover at least one side surface, except for the first surface and the second surface.

12. The electronic device of claim 11, wherein the cover glass includes:
    a connector hole in which an external device is connected to at least a partial area thereof.

* * * * *